United States Patent
Ma et al.

(10) Patent No.: US 10,290,273 B2
(45) Date of Patent: May 14, 2019

(54) DISPLAY PIXEL STRUCTURE, ARRAY SUBSTRATE, AND DISPLAY DEVICE

(71) Applicant: Wuhan China Star Optoelectronics Technology Co., Ltd., Wuhan, Hubei (CN)

(72) Inventors: Liang Ma, Guangdong (CN); Wei-Ping Yeh, Guangdong (CN); Cong Wang, Guangdong (CN); Zuomin Liao, Guangdong (CN); Jun Xia, Guangdong (CN)

(73) Assignee: Wuhan China Star Optoelectronics Technology Co., Ltd, Wuhan, Hubei (CN)

( * ) Notice: Subject to any disclaimer, the term of this patent is extended or adjusted under 35 U.S.C. 154(b) by 0 days.

(21) Appl. No.: 15/737,211

(22) PCT Filed: Jun. 27, 2017

(86) PCT No.: PCT/CN2017/090418
§ 371 (c)(1),
(2) Date: Dec. 15, 2017

(87) PCT Pub. No.: WO2018/214225
PCT Pub. Date: Nov. 29, 2018

(65) Prior Publication Data
US 2018/0374439 A1    Dec. 27, 2018

(51) Int. Cl.
*G09G 3/36* (2006.01)
*G02F 1/1362* (2006.01)
*H01L 27/12* (2006.01)

(52) U.S. Cl.
CPC ..... *G09G 3/3655* (2013.01); *G02F 1/136286* (2013.01); *G09G 3/3607* (2013.01); *H01L 27/1214* (2013.01)

(58) Field of Classification Search
CPC .............. G09G 3/3655; G09G 3/3607; H01L 27/1214; G02F 1/136286
See application file for complete search history.

(56) References Cited

U.S. PATENT DOCUMENTS

2012/0169956 A1* 7/2012 Lai .................... G02F 1/136213
349/42
2012/0200813 A1    8/2012 Morimoto
(Continued)

FOREIGN PATENT DOCUMENTS

CN    100458532 C    2/2009
CN    102169264 A    8/2011
(Continued)

Primary Examiner — Premal R Patel
(74) Attorney, Agent, or Firm — Andrew C. Cheng

(57) ABSTRACT

A display pixel structure includes a plurality of pixel units arranged in an array. Each of the pixel units comprises the first sub-pixel, the second sub-pixel, the third sub-pixel and the fourth sub-pixel. Each of the sub-pixels includes a TFT switch. A ratio between a width/length ratio of the TFT switch of one of the first sub-pixel, the second sub-pixel, and the third sub-pixel or an average of width/length ratios of multiple TFT switches thereof and a width/length ratio of the TFT switch of the fourth sub-pixel is equal to a ratio between a storage capacitance of one of the first sub-pixel, the second sub-pixel, and the third sub-pixel or an average of multiple storage capacitances thereof and a storage capacitance of the fourth sub-pixel. An array substrate and a liquid crystal display device are also disclosed.

17 Claims, 3 Drawing Sheets

(56) References Cited

U.S. PATENT DOCUMENTS

| | | | |
|---|---|---|---|
| 2012/0320297 A1* | 12/2012 | Itsumi | G09G 3/3648 349/43 |
| 2014/0253835 A1* | 9/2014 | Li | G02F 1/1343 349/42 |
| 2015/0123885 A1* | 5/2015 | Adachi | G09G 3/3208 345/77 |
| 2015/0137130 A1* | 5/2015 | Wang | G02F 1/134336 257/72 |
| 2017/0038648 A1* | 2/2017 | Liu | G02F 1/1368 |

FOREIGN PATENT DOCUMENTS

| | | |
|---|---|---|
| CN | 102298227 A | 12/2011 |
| CN | 104656334 A | 5/2015 |

\* cited by examiner

DISPLAY PIXEL STRUCTURE, ARRAY SUBSTRATE, AND DISPLAY DEVICE

CROSS REFERENCE TO RELATED APPLICATIONS

This application claims the priority of Chinese Patent Application No. 201710359945.6 filed on May 20, 2017, titled "Display Pixel Structure, Array Substrate, and Display Device", the disclosure of which is incorporated herein by reference in its entirety.

BACKGROUND OF THE INVENTION

1. Field of the Invention

The present invention relates to the field of display technology, and more particularly to a display pixel structure, an array substrate, and a display device.

2. The Related Arts

With the diversified development of display panels, people place more and more strict requirements on display devices, such as mobile phones and computers. To meet the needs of the general public, the display panel manufacturers are making adjustment in the designs of display panels. For example, the designs are modified to reduce power consumption of the display panels and different color resist materials are used for improving displaying performance of the display panels. Concerning designs that reduce panel power consumption, they can be realized through reducing thin-film transistors (TFTs) involved in gate-driver-on-array (GOA) techniques applied to array substrates and changing pixel configurations. Solutions that are thus proposed for changing pixel configurations include for example an arrangement of RGBW (Red/Green/Blue/White) panel. Adopting RGBW pixel configurations may help lower down power consumption of a panel, yet to display a pure color or a color image, a panel adopting RGBW pixel configuration, as compared with a panel adopting a RGB (Red/Green/Blue) pixel configuration, may show a pure color with relatively low brightness under similar background image, and thus, the display image may get distorted, and even more, image clarity and displaying performance may be affected to some extents.

In view of the above problems, in designing a RGBW pixel based panel, to reduce power consumption of the panel, while also improving displaying performance of the panel, most of the solutions adopted involve non-symmetric RGBW pixel configurations and irregularly-shaped RGBW pixel configurations. In a practical design process, this can be achieved by increasing the ratios of R/G/B pixels and reducing that of W pixel so that distortion of a color image of a RGBW panel caused by the W pixel can be reduced thereby improving the optical displaying performance of a color image. Since a non-symmetric pixel configuration is achieved through making designs of R/G/B pixels different from that of W pixel the storage capacitances thereof are also different, while the parasitic capacitance of the four color sub-pixels of R, G, B, and W and TFTs are identical. This leads to W pixel being different, in respect of feedthrough voltage, charging, and electrical leakage, from the R, G, and B pixels, and thus issues such as crosstalk and flicker may occur.

SUMMARY OF THE INVENTION

Embodiments of the present invention provide a display pixel structure, an array substrate, and a display device, which may help eliminate phenomena of crosstalk and flicker resulting from differences of feedthrough voltage, charging, and electric leakage caused by storage capacitances of pixels being different, while TFTs and parasitic capacitances are identical.

In one aspect, embodiments of the present invention provide a display pixel structure, which comprises a plurality of pixel units arranged in an array, each of the pixel units comprising a first sub-pixel, a second sub-pixel, a third sub-pixel, and a fourth sub-pixel, each of which comprises a thin-film transistor (TFT) switch, wherein a ratio between a width/length ratio of the TFT switch of one of the first sub-pixel, the second sub-pixel, and the third sub-pixel and a width/length ratio of the TFT switch of the fourth sub-pixel is equal to a ratio between a storage capacitance of one of the first sub-pixel, the second sub-pixel, and the third sub-pixel and a storage capacitance of the fourth sub-pixel; or alternatively, a ratio between an average of width/length ratios of the TFT switches of at least two of the first sub-pixel, the second sub-pixel, and the third sub-pixel and a width/length ratio of the TFT switch of the fourth sub-pixel is equal to a ratio between an average of storage capacitances of at least two of the first sub-pixel, the second sub-pixel, and the third sub-pixel and a storage capacitance of the fourth sub-pixel.

In the above display pixel structure, the storage capacitances of the first sub-pixel, the second sub-pixel, and the third sub-pixel are identical and the width/length ratios of the TFT switches of the first sub-pixel, the second sub-pixel, and the third sub-pixel are identical; and the ratio between the width/length ratio of the TFT switch of one of the first sub-pixel, the second sub-pixel, and the third sub-pixel and the width/length ratio of the TFT switch of the fourth sub-pixel is equal to the ratio between the storage capacitance of one of the first sub-pixel, the second sub-pixel, and the third sub-pixel and the storage capacitance of the fourth sub-pixel.

In the above display pixel structure, with the storage capacitances of the first sub-pixel, the second sub-pixel, and the third sub-pixel being identical, a length of the TFT switch of one of the first sub-pixel, the second sub-pixel, and the third sub-pixel is identical to a length of the TFT switch of the fourth sub-pixel and a ratio between a width of the TFT switch of one of the first sub-pixel, the second sub-pixel, and the third sub-pixel and a width of the TFT switch of the fourth sub-pixel is equal to a ratio between the storage capacitance of one of the first sub-pixel, the second sub-pixel, and the third sub-pixel and the storage capacitance of the fourth sub-pixel.

In the above display pixel structure, with the storage capacitances of the first sub-pixel, the second sub-pixel, and the third sub-pixel being identical, a width of the TFT switch of one of the first sub-pixel, the second sub-pixel, and the third sub-pixel is identical to a width of the TFT switch of the fourth sub-pixel and a ratio between a length of the TFT switch of one of the first sub-pixel, the second sub-pixel, and the third sub-pixel and a length of the TFT switch of the fourth sub-pixel is equal to a ratio between the storage capacitance of one of the first sub-pixel, the second sub-pixel, and the third sub-pixel and the storage capacitance of the fourth sub-pixel.

In the above display pixel structure, with the storage capacitances of the first sub-pixel, the second sub-pixel, and the third sub-pixel being identical, a length and a width of the TFT switch of one of the first sub-pixel, the second sub-pixel, and the third sub-pixel are different from a length and a width of the TFT switch of the fourth sub-pixel and a ratio between a width/length ratio of the TFT switch of one of the first sub-pixel, the second sub-pixel, and the third sub-pixel and a width/length ratio of the TFT switch of the fourth sub-pixel is equal to a ratio between the storage capacitance of one of the first sub-pixel, the second sub-pixel, and the third sub-pixel and the storage capacitance of the fourth sub-pixel.

In the above display pixel structure, the first sub-pixel, the second sub-pixel, the third sub-pixel, and the fourth sub-pixel have surface areas that are identical and the TFT switches of the first sub-pixel, the second sub-pixel, the third sub-pixel, and the fourth sub-pixel are arranged in the fourth sub-pixel.

In the above display pixel structure, the first sub-pixel, the second sub-pixel, the third sub-pixel, and the fourth sub-pixel of each of the pixel units are arranged in a two row by two column array; and the first sub-pixel, the second sub-pixel, and the third sub-pixel are respectively a red sub-pixel, a green sub-pixel, and a blue sub-pixel of a combination, and the fourth sub-pixel is a white sub-pixel or a yellow sub-pixel.

In the above display pixel structure, the display pixel structure further comprises a plurality of gate lines that are parallel and a plurality of data lines that perpendicular to the gate lines, the gate lines and the data lines surrounding and delimiting the first sub-pixel, the second sub-pixel, the third sub-pixel, and the fourth sub-pixel.

In another aspect, embodiments of the present invention provide an array substrate, and the array substrate comprises the above display pixel structure.

In another aspect, embodiments of the present invention provide a display device, and the display device comprises the above array substrate.

In summary, embodiments of the present invention provide a display pixel structure, an array substrate, and a display device, which help eliminate phenomena of crosstalk and flicker caused in a non-symmetric RGBW pixel arrangement or an irregularly-shaped RGBW pixel arrangement by differences of feedthrough voltage, charging, and electric leakage resulting from pixels having different storage capacitances and identical TFTs and parasitic capacitances.

BRIEF DESCRIPTION OF THE DRAWINGS

To more clearly explain the technical solution proposed in an embodiment of the present invention and that of the prior art, a brief description of the drawings that are necessary for describing the embodiment or the prior art is given as follows. It is obvious that the drawings that will be described below show only some embodiments of this application. For those having ordinary skills of the art, other obvious variations may be readily available from these attached drawings without the expense of creative effort and endeavor.

DETAILED DESCRIPTION OF THE PREFERRED EMBODIMENTS

Figure 1:
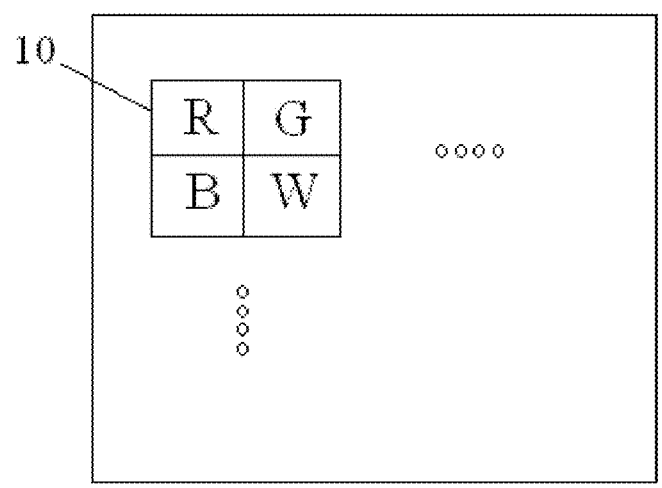
FIG. 1 is a schematic view illustrating a pixel arrangement of a display pixel structure according to the present invention.

A clear and complete description will be given to technical solutions provided by embodiments of the present invention with reference to the attached drawings of the embodiments of the present invention. However, the embodiments so described are only some, but not all, of the embodiments of the present invention. Other embodiments that are available to those having ordinary skills of the art without the expense of creative effort and endeavor are considered belonging to the scope of protection of the present invention.

In addition, the description given below for each embodiment is made with reference to the attached drawings to exemplify specific embodiments that the present invention may be put into practice. Direction related terminology used in the present invention, such as "up", "down", "front", "rear", "left", "right", "internal", "external", and "lateral", is provided as direction defined in the drawing sheets. Thus, using the direction related terminology, which is for better and more clearly describing and understanding of the present invention and is not for indicating or implying any specific orientation that a device or an element described must take or the device or element must be structured or operated at a specific orientation, should thus be appreciated as not imposing constraints to the present invention.

In the description of the present invention, it should be noted that unless specifically required and set, the terms "installation", "connection", and "jointing" as used herein should be interpreted in a broad way, such as being fixedly connected or removably connected, or integrally connected; or being mechanically connected; or being directly connected, or indirectly connected with intervening media therebetween, or interiors of two element being in communication with each other. For those having ordinary skills in the art, the specific meaning of these terms used in the present invention can be appreciated for any actual situations.

Further, in the description of the present invention, unless stated otherwise, "multiple" means two or more than two. Terms related to "operations", if used in this specification, should means independent operations and for cases where distinction from other operations, any operation that achieve a desired effect of the operation is included in the terms so used. Further, the symbol "-" as used in this specification stands for a numeral range, which comprises a range of which the minimum and the maximum are respectively the figures set in front of and behind "-". In the drawings, units having similar or the same structure are designated with the same reference numerals.

An embodiment of the present invention provides a display pixel structure, which helps eliminate crosstalk and flicker resulting from differences of feedthrough voltage, charging, and electric leakage among pixels occurring in irregularly-shaped or non-symmetric pixel configurations. A detailed description will be provided below.

Figure 2:
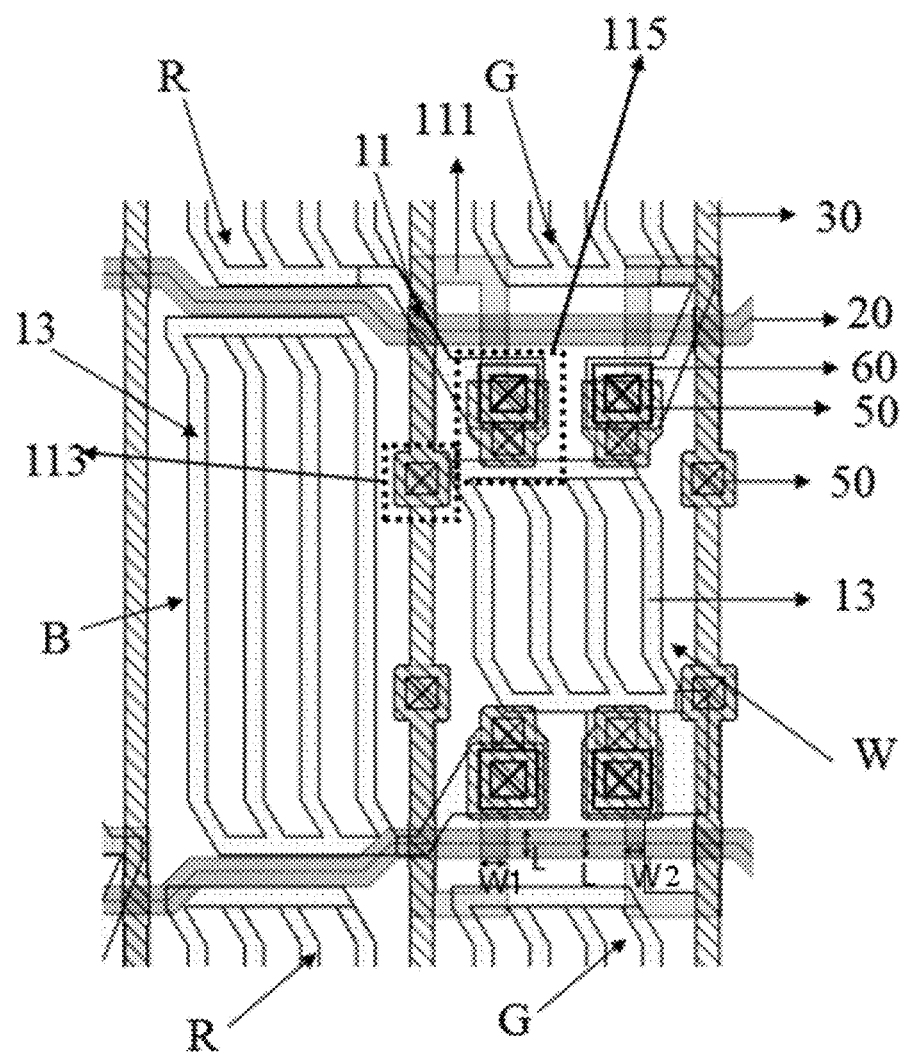
FIG. 2 is a schematic view illustrating an internal structure of the display pixel structure according to the present invention.

Referring collectively to FIGS. 1 and 2, FIG. 1 is a schematic view showing a pixel arrangement of a display pixel structure according to the present invention and FIG. 2 is a schematic view showing an internal structure of the display pixel structure according to the present invention. Embodiments of the present invention provide a display pixel structure, which comprises a plurality of pixel units 10 arranged in an array. Each of the pixel units 10 comprises a first sub-pixel, a second sub-pixel, a third sub-pixel, and the fourth sub-pixel of different colors, wherein the first sub-pixel, the second sub-pixel, and the third sub-pixel are each individually one of a red sub-pixel R, a green sub-pixel G, and a blue sub-pixel B and the fourth sub-pixel is a white sub-pixel W or a yellow sub-pixel Y. In an embodiment of the present invention, a white sub-pixel W is taken as an example of the fourth sub-pixel for illustration.

The red sub-pixel R, the green sub-pixel G, and the blue sub-pixel B of each of the pixel units 10 (the above sub-pixels of the three colors being collectively referred to as "R/G/B three-color sub-pixels" hereinafter) have storage capacitances that are identical or different, and the white sub-pixel W has storage capacitance that is generally smaller than the storage capacitance of any one sub-pixel of the R/G/B three-color sub-pixels. Each of the sub-pixels comprises a thin-film transistor (TFT) switch 11 and a pixel electrode 13, and a ratio between a width/length ratio of the TFT switch 11 of one of the R/G/B three-color sub-pixels and a width/length ratio of the TFT switch 11 of the white sub-pixel W is identical to a ration between the storage capacitance of one of the R/G/B three-color sub-pixels and the storage capacitance of the white sub-pixel W; or alternatively, a ratio between an average of width/length ratios of the TFT switches 11 of at least two of the R/G/B three-color sub-pixels and a width/length ratio of the TFT switch 11 of the white sub-pixel W is identical to a ratio between an average of the storage capacitances of at least two of the R/G/B three-color sub-pixels and the storage capacitance of the white sub-pixel W. The width/length ratio of the TFT switch 11 is a ratio between a width and a length of a channel of the TFT switch 11.

Since parasitic capacitance of a sub-pixel is proportional to the width/length ratio, in conducting the above way of arranging the width/length ratio of each of the sub-pixels, the parasitic capacitance of each of the sub-pixels must be adjusted accordingly so as to prevent poor displaying resulting from a difference in feedthrough voltage caused by the storage capacitances of the sub-pixels being different while the parasitic capacitances are identical.

In the display pixel structure of the instant embodiment, by setting the ratio between the width/length ratio of the TFT switch 11 of the white sub-pixel W and the width/length ratio of the TFT switch 11 of at least one of the R/G/B three-color sub-pixels to correspond to the ratio between the storage capacitance of the white sub-pixel W and the storage capacitance of at least one of the R/G/B three-color sub-pixels, phenomena such as crosstalk and flicker resulting from the situation of the prior art that the storage capacitances of the white sub-pixel W is different from any one of the R/G/B three-color sub-pixels being different and the TFT switches and the parasitic capacitances thereof are the same can be eliminated.

In an embodiment of the present invention, the storage capacitances of the R/G/B three-color sub-pixels are identical and the width/length ratios of the TFT switches 11 of the R/G/B three-color sub-pixels are identical, and accordingly, the ratio between the width/length ratio of the TFT switch 11 of any one of the R/G/B three-color sub-pixels and the width/length ratio of the TFT switch 11 of the white sub-pixel W is equal to the ratio between the storage capacitance of any one of the R/G/B three-color sub-pixels and the storage capacitance of the white sub-pixel W.

Further, when the storage capacitances of the R/G/B three-color sub-pixels are identical, by setting lengths of the TFT switches 11 of any one of the R/G/B three-color sub-pixels and the white sub-pixel W to be the same, a ratio of widths of the TFT switches 11 of any one of the R/G/B three-color sub-pixels and the white sub-pixel W and the ratio between the storage capacitances of any one of the R/G/B three-color sub-pixels and the white sub-pixel W are identical. With additional reference to FIG. 2, in the instant embodiment, the lengths of the TFT switches 11 of any one of the R/G/B three-color sub-pixels and the white sub-pixel W are identical, both being L, and the widths of the TFT switches 11 of the R/G/B three-color sub-pixels are all W1 and the width of the TFT switch 11 of the white sub-pixel W is W2, W1 being greater than W2, then the ratio between the width/length ratio of the TFT switch 11 of any one of the R/G/B three-color sub-pixels, which is W1/L, and the width/length ratio of the TFT switch 11 of the white sub-pixel W, which is W2/L, is W1/W2, which is equal to the ratio between the storage capacitance of any one of the R/G/B three-color sub-pixels and the storage capacitance of the white sub-pixel W.

It is appreciated that, correspondingly, when the storage capacitances of the R/G/B three-color sub-pixels are identical, it is possible to set the widths of the TFT switches 11 of any one of the R/G/B three-color sub-pixels and the white sub-pixel W to be identical, and then, the ration between the lengths of the TFT switches 11 of any one of the R/G/B three-color sub-pixels and the white sub-pixel W is equal to the ratio between the storage capacitances of any one of the R/G/B three-color sub-pixels and the white sub-pixel W.

It is appreciated that when the storage capacitances of the R/G/B three-color sub-pixels are identical, it is possible to set the TFT switches 11 of any one of the R/G/B three-color sub-pixels and the white sub-pixel W to be different in both width and length, but the ratio between the width/length ratio of the TFT switch 11 of any one of the R/G/B three-color sub-pixels and the width/length ratio of the TFT switch 11 of the white sub-pixel W and the ratio between the storage capacitance of any one of the R/G/B three-color sub-pixels and the storage capacitance of the white sub-pixel W is the same.

In an embodiment of the present invention, the ration between the width/length ratio of the TFT switch 11 of any one of the R/G/B three-color sub-pixels and the width/length ratio of the TFT switch 11 of the white sub-pixel W is equal to the ratio between the storage capacitance of any one of the R/G/B three-color sub-pixels and the storage capacitance of the white sub-pixel W.

Specifically, the above described arrangement concerning the lengths and the widths of the TFT switches 11 of any one of the R/G/B three-color sub-pixels and the white sub-pixel W is made in consideration of aperture ratios of the sub-pixels for maximizing the aperture ratios of all the sub-pixels. Thus, in the instant embodiment, to maximize the aperture ratios of all the sub-pixels, the lengths of the TFT switches 11 of all the sub-pixels are set equal, and the ratio of the width/length ratios of the TFT switches 11 of any one of the R/G/B three-color sub-pixels and the white sub-pixel W is set to correspond to the ratio of the storage capacitances of any one of the R/G/B three-color sub-pixels and the white sub-pixel W. With such an arrangement, the aperture ratio of each of the sub-pixels can be set to be as large as possible, and a manufacturing operation of the TFT switch 11 can be simplified.

In an embodiment of the present invention, the R/G/B three-color sub-pixels and the white sub-pixel W are of the same surface areas and the two are arranged, collectively, in a 2*2 array (namely two rows by two columns), and in each of the pixel units, the TFT switches 11 of the R/G/B three-color sub-pixels and the TFT switch 11 of the white sub-pixel W are collectively set in the white sub-pixel W of the pixel unit. Thus, the pixel electrode 13 of the white sub-pixel W occupies an area that is smaller than an area occupied by the pixel electrode 13 of any one of the R/G/B three-color sub-pixels so as to provide a sufficient space for accommodating the TFT switches of the R/G/B three-color sub-pixels and the white sub-pixel W.

It is appreciated that the TFT switches 11 of the four sub-pixels of each of the pixel units 10 are arranged in the white sub-pixel W in a manner of circumferentially surrounding the pixel electrode 13 of the white sub-pixel W of the pixel units 10.

In an embodiment of the present invention, in the pixel units, the red sub-pixel R and the green sub-pixel G are arranged in a first row and the blue sub-pixel B and the white sub-pixel W are arranged in a row next to the red sub-pixel R and the green sub-pixel G, and correspondingly, the TFT switches 11 of the red sub-pixel R and the green sub-pixel G are arranged at one end of the pixel electrode 13 of the white sub-pixel W and the TFT switches 11 of the blue sub-pixel B and the white sub-pixel W are arranged at an opposite end of the pixel electrode 13 of the white sub-pixel W.

Further, the pixel electrodes 13 of the four sub-pixels including the R/G/B three-color sub-pixels and the white sub-pixel W are of the same shape, but the pixel electrode 13 of the white sub-pixel W has a relatively small size (namely the pixel electrode 13 of the white sub-pixel W is smaller than the pixel electrode of the red sub-pixel R, the green sub-pixel G, or the blue sub-pixel B), so as to provide a sufficient space for accommodating the fourth TFT switches 11 of the pixel unit 10 and also to make the storage capacitance of the white sub-pixel W smaller than the storage capacitance of any one of the R/G/B three-color sub-pixels. In this arrangement, the pixel electrode 13 of each of the sub-pixel comprises strips-like electrode body, made in a hollowed pattern, (not shown) and connection sections (not shown) extended from the electrode body, and in embodiments of the present invention, the connection sections can be in the form of block, such as a circular or a rectangular block, for easy connection to the TFT switch 11 by way of a via.

Further, the display pixel structure additionally comprises a plurality of gate lines 20 that are arranged parallel and a plurality of data lines 30 that are arranged perpendicular to the gate lines 20. The gate lines 20 and the data lines 30 surround and delimit each of the sub-pixels of each of the pixel units 10 and the TFT switch 11 of each of the sub-pixels is connected to the gate lines 20 and the data lines 30.

Figure 3:
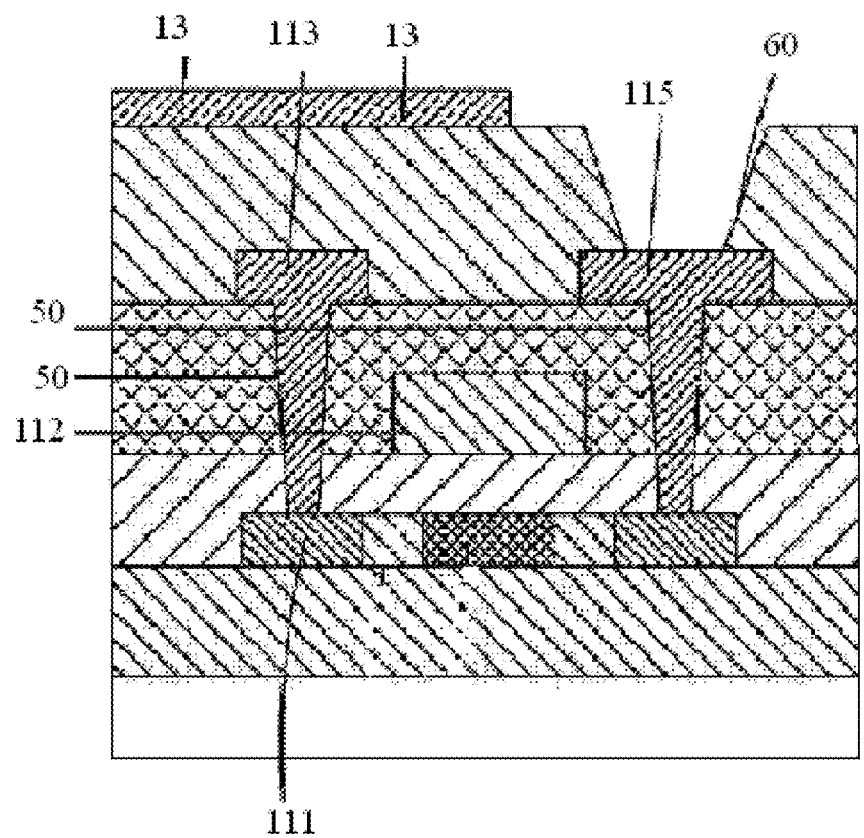
FIG. 3 is a schematic view, in a sectioned form, illustrating an array substrate according to the present invention.

Referring additionally to FIG. 3, further, the TFT switch 11 comprises an active layer 111, a gate electrode 112, a source electrode 113, and a drain electrode 115, wherein the gate electrode 112 is arranged at a location exactly above a channel zone of the active layer 111 and the source electrode 113 and the drain electrode 115 are respectively connected to contact zones at two ends of the active layer 111. Specifically, the active layer 111 is connected through first vias 50 to the data line 30 and the source electrode 113 and the drain electrode 115 are formed in the first vias 50; and the pixel electrode 13 is connected, through the second via 60 and the first vias 50, to the active layer 111. The structure of the TFT switch 11 is the same as that of the TFT switch involved in a known pixel circuit and thus further details will be omitted herein.

It is appreciated that the gate lines 20, the data lines 30, the gate electrode 112, the source electrode 113, the drain electrode 115, and the pixel electrode 13 can each be made of a material selected as a one of molybdenum, titanium, aluminum, and copper, or a stacked combination of multiple ones thereof.

It is appreciated that the first vias 50 and the second via 60 may have shapes that are all rectangular.

A pixel unit that is made up of a red sub-pixel R, a green sub-pixel G, a blue sub-pixel B, and a yellow sub-pixel Y may be achieved with a structure and a design principle that are the same as those of the pixel unit including a red sub-pixel R, a green sub-pixel G, a blue sub-pixel B, and a white sub-pixel W. In other words, the design principle of a display pixel structure that is designed on the basis of RGBY pixels can be the same as the design principle of the above-described display pixel structure designed on the basis of RGBW pixel and thus, repeated description will be omitted herein.

The present invention provides a novel pixel design that is applicable to a RGBW display panel or a RGBY display panel and is applicable to all sorts of non-symmetric pixel configurations and irregularly-shaped pixel configurations, and for example, the pixel design of a RGBW panel can be made by selecting a TFT having a corresponding width/length ratio for an irregular pixel in order to compensate poor displaying resulting from the pixel structure being different to thereby improve stability of a panel involving irregular RGBW or RGBY pixel to achieve a balance between power consumption and displaying performance of a product.

Embodiments of the present invention also provide an array substrate, which comprises the above-described display pixel structure.

Embodiments of the present invention further provide a liquid crystal display device, which comprises the above-described array substrate.

A specific structure of the array substrate is the same as that described in the above embodiments and repeated description will be omitted herein.

The liquid crystal display device may specifically be: a liquid crystal panel, a liquid crystal television, a liquid crystal display, an electronic paper, a digital picture frame, and a mobile phone.

In the instant embodiment, the liquid crystal display device, in a panel adopting a RGBW or RGBY pixel arrangement, through selecting a TFT having a corresponding width/length ratio for an irregular pixel arrangement or a non-symmetric pixel arrangement to compensate poor displaying resulting from the pixel structure being different, stability of a panel involving irregular RGBW or RGBY pixel can be improved to achieve a balance between power consumption and displaying performance of a product.

In the description of the disclosure, the terms "an embodiment", "some embodiments", "an illustrative example", "a specific example", and "some examples" as used herein refer to specific features, structures, materials, or characteristics involved in the embodiment(s) or example(s) are included in at least one embodiment or example of the present invention. In the disclosure, expressions referring to the above mentioned terms may not be referring to the same embodiment or example. Further, the description of the specific features, structures, materials, or characteristics can be combined, through proper arrangements, in any specific one or multiple ones of embodiments or examples.

The above provides a detailed description of an array substrate and a manufacturing method, and a liquid crystal display device, according to embodiments of the present invention. Specific examples are used in the specification to expound the principle and embodying ways of the present invention. The description of the embodiments is provided to help understanding of the method of the present invention, as well as the essential idea thereof. Further, for those having ordinary skills in the art, it can be contemplated to make modifications, based on the idea of the present invention, on the embodiments and applications thereof. In conclusion, the specification should not be interpreted as constraint to the scope of the present invention.

What is claimed is:

1. A display pixel structure, comprising a plurality of pixel units arranged in an array, each of the pixel units comprising a first sub-pixel, a second sub-pixel, a third sub-pixel, and a fourth sub-pixel, each of which comprises a thin-film transistor (TFT) switch, wherein a ratio between a width/length ratio of the TFT switch of one of the first sub-pixel, the second sub-pixel, and the third sub-pixel and a width/length ratio of the TFT switch of the fourth sub-pixel is equal to a ratio between a storage capacitance of one of the first sub-pixel, the second sub-pixel, and the third sub-pixel and a storage capacitance of the fourth sub-pixel; or alternatively, a ratio between an average of width/length ratios of the TFT switches of at least two of the first sub-pixel, the second sub-pixel, and the third sub-pixel and a width/length ratio of the TFT switch of the fourth sub-pixel is equal to a ratio between an average of storage capacitances of at least two of the first sub-pixel, the second sub-pixel, and the third sub-pixel and a storage capacitance of the fourth sub-pixel; wherein the storage capacitances of the first sub-pixel, the second sub-pixel, and the third sub-pixel are identical and the width/length ratios of the TFT switches of the first sub-pixel, the second sub-pixel, and the third sub-pixel are identical; and the ratio between the width/length ratio of the TFT switch of one of the first sub-pixel, the second sub-pixel, and the third sub-pixel and the width/length ratio of the TFT switch of the fourth sub-pixel is equal to the ratio between the storage capacitance of one of the first sub-pixel, the second sub-pixel, and the third sub-pixel and the storage capacitance of the fourth sub-pixel.

2. The display pixel structure as claimed in claim 1, wherein with the storage capacitances of the first sub-pixel, the second sub-pixel, and the third sub-pixel being identical, a length of the TFT switch of one of the first sub-pixel, the second sub-pixel, and the third sub-pixel is identical to a length of the TFT switch of the fourth sub-pixel and a ratio between a width of the TFT switch of one of the first sub-pixel, the second sub-pixel, and the third sub-pixel and a width of the TFT switch of the fourth sub-pixel is equal to a ratio between the storage capacitance of one of the first sub-pixel, the second sub-pixel, and the third sub-pixel and the storage capacitance of the fourth sub-pixel.

3. The display pixel structure as claimed in claim 1, wherein with the storage capacitances of the first sub-pixel, the second sub-pixel, and the third sub-pixel being identical, a width of the TFT switch of one of the first sub-pixel, the second sub-pixel, and the third sub-pixel is identical to a width of the TFT switch of the fourth sub-pixel and a ratio between a length of the TFT switch of one of the first sub-pixel, the second sub-pixel, and the third sub-pixel and a length of the TFT switch of the fourth sub-pixel is equal to a ratio between the storage capacitance of one of the first sub-pixel, the second sub-pixel, and the third sub-pixel and the storage capacitance of the fourth sub-pixel.

4. The display pixel structure as claimed in claim 1, wherein with the storage capacitances of the first sub-pixel, the second sub-pixel, and the third sub-pixel being identical, a length and a width of the TFT switch of one of the first sub-pixel, the second sub-pixel, and the third sub-pixel are different from a length and a width of the TFT switch of the fourth sub-pixel and a ratio between a width/length ratio of the TFT switch of one of the first sub-pixel, the second sub-pixel, and the third sub-pixel and a width/length ratio of the TFT switch of the fourth sub-pixel is equal to a ratio between the storage capacitance of one of the first sub-pixel, the second sub-pixel, and the third sub-pixel and the storage capacitance of the fourth sub-pixel.

5. The display pixel structure as claimed in claim 1, wherein the first sub-pixel, the second sub-pixel, the third sub-pixel, and the fourth sub-pixel have surface areas that are identical and the TFT switches of the first sub-pixel, the second sub-pixel, the third sub-pixel, and the fourth sub-pixel are arranged in the fourth sub-pixel.

6. The display pixel structure as claimed in claim 1, wherein the first sub-pixel, the second sub-pixel, the third sub-pixel, and the fourth sub-pixel of each of the pixel units are arranged in a two row by two column array; and the first sub-pixel, the second sub-pixel, and the third sub-pixel are respectively a red sub-pixel, a green sub-pixel, and a blue sub-pixel of a combination, and the fourth sub-pixel is a white sub-pixel or a yellow sub-pixel.

7. The display pixel structure as claimed in claim 1, wherein the display pixel structure further comprises a plurality of gate lines that are parallel and a plurality of data lines that perpendicular to the gate lines, the gate lines and the data lines surrounding and delimiting the first sub-pixel, the second sub-pixel, the third sub-pixel, and the fourth sub-pixel.

8. An array substrate, comprising a display pixel structure, wherein the display pixel structure comprises a plurality of pixel units arranged in an array, each of the pixel units comprising a first sub-pixel, a second sub-pixel, a third sub-pixel, and a fourth sub-pixel, each of which comprises a thin-film transistor (TFT) switch, wherein a ratio between a width/length ratio of the TFT switch of one of the first sub-pixel, the second sub-pixel, and the third sub-pixel and a width/length ratio of the TFT switch of the fourth sub-pixel is equal to a ratio between a storage capacitance of one of the first sub-pixel, the second sub-pixel, and the third sub-pixel and a storage capacitance of the fourth sub-pixel; or alternatively, a ratio between an average of width/length ratios of the TFT switches of at least two of the first sub-pixel, the second sub-pixel, and the third sub-pixel and a width/length ratio of the TFT switch of the fourth sub-pixel is equal to a ratio between an average of storage capacitances of at least two of the first sub-pixel, the second sub-pixel, and the third sub-pixel and a storage capacitance of the fourth sub-pixel; wherein the storage capacitances of the first sub-pixel, the second sub-pixel, and the third sub-pixel are identical and the width/length ratios of the TFT switches of the first sub-pixel, the second sub-pixel, and the third sub-pixel are identical; and the ratio between the width/length ratio of the TFT switch of one of the first sub-pixel, the second sub-pixel, and the third sub-pixel and the width/length ratio of the TFT switch of the fourth sub-pixel is equal to the ratio between the storage capacitance of one of the first sub-pixel, the second sub-pixel, and the third sub-pixel and the storage capacitance of the fourth sub-pixel.

9. The array substrate as claimed in claim 8, wherein with the storage capacitances of the first sub-pixel, the second sub-pixel, and the third sub-pixel being identical, a length of the TFT switch of one of the first sub-pixel, the second sub-pixel, and the third sub-pixel is identical to a length of the TFT switch of the fourth sub-pixel and a ratio between a width of the TFT switch of one of the first sub-pixel, the second sub-pixel, and the third sub-pixel and a width of the TFT switch of the fourth sub-pixel is equal to a ratio between the storage capacitance of one of the first sub-pixel, the second sub-pixel, and the third sub-pixel and the storage capacitance of the fourth sub-pixel.

10. The array substrate as claimed in claim 8, wherein with the storage capacitances of the first sub-pixel, the second sub-pixel, and the third sub-pixel being identical, a width of the TFT switch of one of the first sub-pixel, the second sub-pixel, and the third sub-pixel is identical to a width of the TFT switch of the fourth sub-pixel and a ratio between a length of the TFT switch of one of the first sub-pixel, the second sub-pixel, and the third sub-pixel and a length of the TFT switch of the fourth sub-pixel is equal to a ratio between the storage capacitance of one of the first sub-pixel, the second sub-pixel, and the third sub-pixel and the storage capacitance of the fourth sub-pixel.

11. The array substrate as claimed in claim 8, wherein with the storage capacitances of the first sub-pixel, the second sub-pixel, and the third sub-pixel being identical, a length and a width of the TFT switch of one of the first sub-pixel, the second sub-pixel, and the third sub-pixel are different from a length and a width of the TFT switch of the fourth sub-pixel and a ratio between a width/length ratio of the TFT switch of one of the first sub-pixel, the second sub-pixel, and the third sub-pixel and a width/length ratio of the TFT switch of the fourth sub-pixel is equal to a ratio between the storage capacitance of one of the first sub-pixel, the second sub-pixel, and the third sub-pixel and the storage capacitance of the fourth sub-pixel.

12. The array substrate as claimed in claim 8, wherein the first sub-pixel, the second sub-pixel, the third sub-pixel, and the fourth sub-pixel have surface areas that are identical and the TFT switches of the first sub-pixel, the second sub-pixel, the third sub-pixel, and the fourth sub-pixel are arranged in the fourth sub-pixel.

13. The array substrate as claimed in claim 8, wherein the first sub-pixel, the second sub-pixel, the third sub-pixel, and the fourth sub-pixel of each of the pixel units are arranged in a two row by two column array; and the first sub-pixel, the second sub-pixel, and the third sub-pixel are respectively a red sub-pixel, a green sub-pixel, and a blue sub-pixel of a combination, and the fourth sub-pixel is a white sub-pixel or a yellow sub-pixel.

14. A display device, comprising an array substrate, wherein the array substrate comprises a display pixel structure, the display pixel structure comprising a plurality of pixel units arranged in an array, each of the pixel units comprising a first sub-pixel, a second sub-pixel, a third sub-pixel, and a fourth sub-pixel, each of which comprises a thin-film transistor (TFT) switch, wherein a ratio between a width/length ratio of the TFT switch of one of the first sub-pixel, the second sub-pixel, and the third sub-pixel and a width/length ratio of the TFT switch of the fourth sub-pixel is equal to a ratio between a storage capacitance of one of the first sub-pixel, the second sub-pixel, and the third sub-pixel and a storage capacitance of the fourth sub-pixel; or alternatively, a ratio between an average of width/length ratios of the TFT switches of at least two of the first sub-pixel, the second sub-pixel, and the third sub-pixel and a width/length ratio of the TFT switch of the fourth sub-pixel is equal to a ratio between an average of storage capacitances of at least two of the first sub-pixel, the second sub-pixel, and the third sub-pixel and a storage capacitance of the fourth sub-pixel; wherein the storage capacitances of the first sub-pixel, the second sub-pixel, and the third sub-pixel are identical and the width/length ratios of the TFT switches of the first sub-pixel, the second sub-pixel, and the third sub-pixel are identical; and the ratio between the width/length ratio of the TFT switch of one of the first sub-pixel, the second sub-pixel, and the third sub-pixel and the width/length ratio of the TFT switch of the fourth sub-pixel is equal to the ratio between the storage capacitance of one of the first sub-pixel, the second sub-pixel, and the third sub-pixel and the storage capacitance of the fourth sub-pixel.

15. The display device as claimed in claim 14, wherein with the storage capacitances of the first sub-pixel, the second sub-pixel, and the third sub-pixel being identical, a length of the TFT switch of one of the first sub-pixel, the second sub-pixel, and the third sub-pixel is identical to a length of the TFT switch of the fourth sub-pixel and a ratio between a width of the TFT switch of one of the first sub-pixel, the second sub-pixel, and the third sub-pixel and a width of the TFT switch of the fourth sub-pixel is equal to a ratio between the storage capacitance of one of the first sub-pixel, the second sub-pixel, and the third sub-pixel and the storage capacitance of the fourth sub-pixel.

16. The display device as claimed in claim 14, wherein with the storage capacitances of the first sub-pixel, the second sub-pixel, and the third sub-pixel being identical, a width of the TFT switch of one of the first sub-pixel, the second sub-pixel, and the third sub-pixel is identical to a width of the TFT switch of the fourth sub-pixel and a ratio between a length of the TFT switch of one of the first sub-pixel, the second sub-pixel, and the third sub-pixel and a length of the TFT switch of the fourth sub-pixel is equal to a ratio between the storage capacitance of one of the first sub-pixel, the second sub-pixel, and the third sub-pixel and the storage capacitance of the fourth sub-pixel.

17. The display device as claimed in claim 14, wherein with the storage capacitances of the first sub-pixel, the second sub-pixel, and the third sub-pixel being identical, a length and a width of the TFT switch of one of the first sub-pixel, the second sub-pixel, and the third sub-pixel are different from a length and a width of the TFT switch of the fourth sub-pixel and a ratio between a width/length ratio of the TFT switch of one of the first sub-pixel, the second sub-pixel, and the third sub-pixel and a width/length ratio of the TFT switch of the fourth sub-pixel is equal to a ratio between the storage capacitance of one of the first sub-pixel, the second sub-pixel, and the third sub-pixel and the storage capacitance of the fourth sub-pixel.

* * * * *